US006836153B2

(12) United States Patent
Birrittella

(10) Patent No.: US 6,836,153 B2
(45) Date of Patent: Dec. 28, 2004

(54) SYSTEMS AND METHODS FOR PHASE DETECTOR CIRCUIT WITH REDUCED OFFSET

(75) Inventor: Mark S. Birrittella, Chippewa Falls, WI (US)

(73) Assignee: Cray, Inc., Seattle, WA (US)

( * ) Notice: Subject to any disclaimer, the term of this patent is extended or adjusted under 35 U.S.C. 154(b) by 0 days.

(21) Appl. No.: 10/357,716

(22) Filed: Feb. 4, 2003

(65) Prior Publication Data

US 2004/0150446 A1 Aug. 5, 2004

(51) Int. Cl.[7] .................................................. H03K 9/00
(52) U.S. Cl. ............................ 327/3; 327/12; 327/158
(58) Field of Search ............................ 327/2, 12, 3, 7, 327/156, 158, 161, 157, 276

(56) References Cited

U.S. PATENT DOCUMENTS

| 4,972,160 | A  |   | 11/1990 | Sylvain ........................ 331/1 A |
| 5,027,085 | A  |   | 6/1991  | DeVito ........................ 331/1 A |
| 5,440,274 | A  |   | 8/1995  | Bayer ......................... 331/1 A |
| 5,619,148 | A  | * | 4/1997  | Guo ............................. 327/3 |
| 5,619,171 | A  | * | 4/1997  | Rijckaert et al. ........... 331/1 A |
| 5,940,608 | A  |   | 8/1999  | Manning ..................... 395/558 |
| 6,307,411 | B1 |   | 10/2001 | Kerner ........................ 327/156 |
| 6,340,904 | B1 |   | 1/2002  | Manning ..................... 327/156 |
| 6,404,248 | B1 | * | 6/2002  | Yoneda ....................... 327/158 |

* cited by examiner

Primary Examiner—Dinh T. Le
(74) Attorney, Agent, or Firm—Schwegman, Lundberg, Woessner & Kluth, P.A.

(57) ABSTRACT

Systems and methods for synchronizing a system clock signal with a reference clock signal having a reduced phased offset to improve operating speeds of integrated circuits. This is accomplished by generating delayed system and reference clock signals by using the system and reference clock signals. The generated delayed clock signals are then monitored to determine the arrival of the raising and falling edges of the delayed clock signals. The system clock signal is then compensated based on the determination of the arrival of the delayed clock signals to substantially synchronize the system clock signal with respect to the reference clock signal.

49 Claims, 4 Drawing Sheets

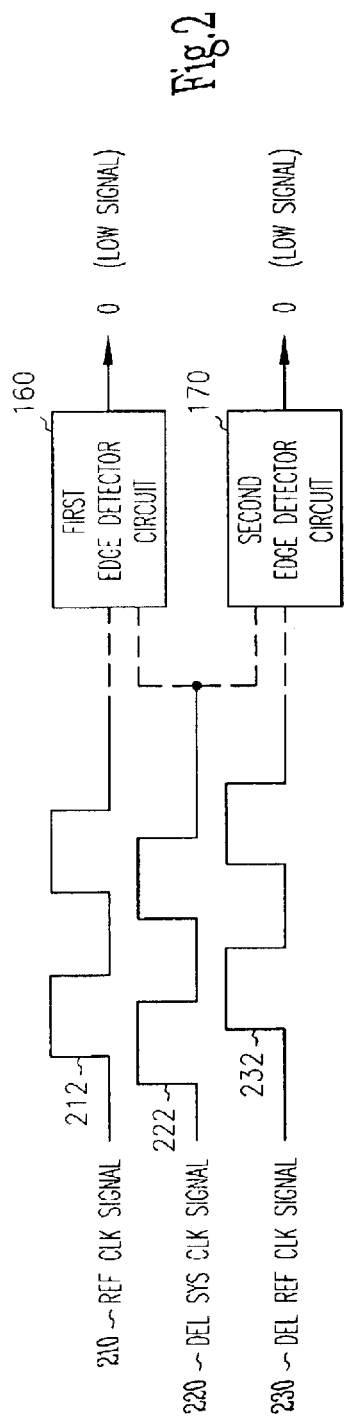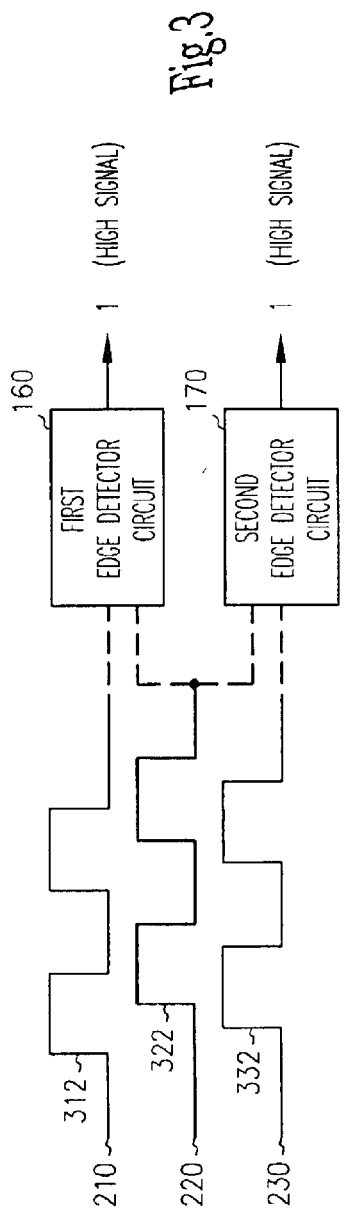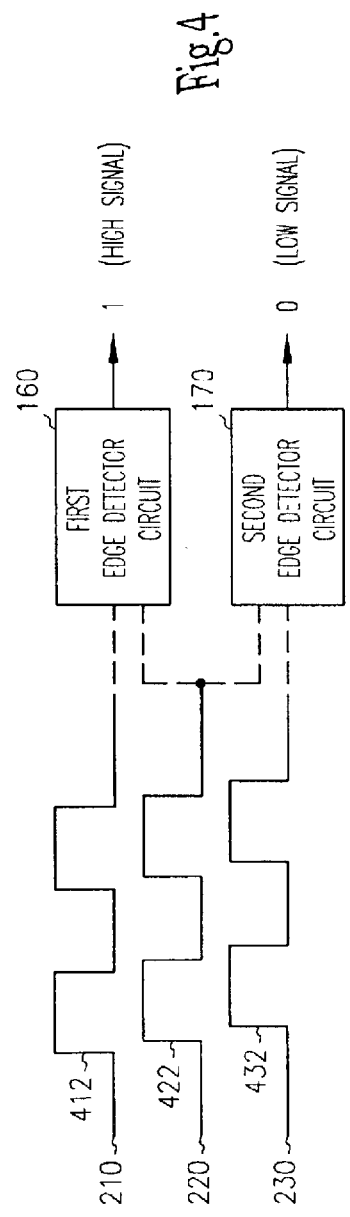

SYSTEMS AND METHODS FOR PHASE DETECTOR CIRCUIT WITH REDUCED OFFSET

FIELD OF THE INVENTION

The present invention is related to digital clock circuits, and more particularly to a digital delay lock loop (digital DLL) circuit for generating synchronized signals to a reference signal.

BACKGROUND INFORMATION

Digital DLL circuits have been commonly used for the purpose of generating a signal in a preferred phase relationship relative to another signal. A digital DLL adjusts its own internal clock to bring it into alignment with some external reference clock. The phase relationship between the reference clock and the internal clock is then referred to as being locked. An essential part of a digital DLL is a phase detector, which generates a control signal based on the deviation of the internal clock with reference to the reference clock. This control signal is then used to correct the phase deviation.

A phase detector circuit is used in a control loop in which a certain fixedly predetermined phase offset is generated between the internal and reference clocks. This means that a digital DLL circuit can only generate and keep a constant phase difference between the internal and reference clock signals corresponding to the phase offset. This also means that the digital DLL circuit can only synchronize the reference and internal clock signals within in this phase offset uncertainty. That is, the resolution of the synchronization of the reference and internal clocks depends on the phase offset. Typically, in a digital DLL circuit the two signals can only be synchronized to within the delay through one minimum delay element. Therefore, the resolution of synchronization in digital DLL circuits ends up being slightly higher than plus or minus one minimum delay element.

However, such a resolution based on the phase offset or delay generated using NAND gates in a digital DLL circuit for synchronization of the reference and internal clocks is still not desirable. As clock speeds continue to increase, timing tolerances between reference and internal clocks have become increasingly severe. The problem is exacerbated by the increasing complexity in contemporary integrated circuits, which require a large number of events to be accurately timed with respect to each other. The problem is further exacerbated by varying silicon delays due to variations in the process parameters during IC fabrication of semiconductor chips. These timing constraints threaten to create a significant roadblock to increasing the operating speeds of many conventional integrated circuits.

In addition, the phase offset generated by digital DLL circuits during synchronization of the internal and reference clocks produces undesirable phase jitter when the reference and internal clocks are within the window of a phase offset. Jitter is defined as abrupt, spurious variations in the phase of successive pulses as referenced to the phase of a continuous oscillator, causing deleterious variations in the output frequency. Edge sensitive circuits using flip-flops are generally sensitive to jitter and the circuits may be perturbed for many cycles after a jitter event. Therefore the phase detector circuit may have to be turned off to avoid negative effects of jitter. Once the phase detector circuit is turned off it can no longer adjust for temperature and voltage drifts, which can result in an increased phase offset as the internal clock can drift from the reference.

For the reasons stated above, and for reasons stated below which will become apparent to those skilled in the art upon reading and understanding the present specification, there is a need in the art for a digital DLL circuit including a phase detector circuit that can generate an internal clock signal with a reduced phase offset with respect to a reference clock signal. Further, there is a need in the art for a digital DLL circuit with a low phase offset jitter in response to phase offset and when the internal clock is within the window of the reference clock.

SUMMARY OF THE INVENTION

The above-mentioned shortcomings, disadvantages and problems are addressed by the present invention, which will be understood by reading and studying the following specification.

In one aspect of the present invention, a system and method is described for synchronizing a system clock signal with a reference clock signal having a reduced phase offset. This is accomplished by generating delayed system and delayed reference clock signals by using the system and reference clock signals. The generated delayed clock signals are then monitored to determine the order of arrival of the raising and falling edges of the delayed clock signals. The system clock signal is then compensated as a function of the order of arrival of the delayed clock signals to substantially synchronize the system clock signal with the reference clock signal.

According to one aspect of the present invention, a method of synchronizing a system clock signal with a reference clock signal includes generating a delayed reference clock signal having a first minimum time delay using a reference clock signal. In addition, a delayed system clock signal having second minimum time delay is generated using a system clock signal. The clock signals include first and second edges in each clock cycle. The second minimum time delay is about half the first minimum time delay. A first signal is then generated based on the order of arrival of the first and second edges of the reference clock signal with respect to the first and second edges of the delayed system clock signal in each clock cycle. In addition, a second signal is then generated based on the order of arrival of the first and second edges of the delayed reference clock signal with respect to the first and second edges of the delayed system clock signal in each clock cycle. A logic signal is then generated based on the generated first and second signals. The system clock signal is then compensated to substantially synchronize the system clock signal with the reference clock signal as a function of the received logic signal.

Another aspect of the present invention provides a digital delay lock loop circuit for synchronizing a system clock signal with a reference clock signal, includes a delayed reference clock circuit, a delayed system clock circuit, a phase detector circuit, and a compensation circuit. The compensation circuit further includes a first edge detector circuit, a second edge detector circuit, and a logic circuit. The delayed reference clock circuit receives a reference clock signal and generates a delayed reference clock signal having a first minimum time delay with respect to the reference clock signal. The delayed system clock circuit receives a system clock signal and generates a delayed system clock signal having a second minimum time delay, the second minimum time delay being one half the first minimum time delay. The first edge detector circuit receives the reference and delayed system clock signals and generates a first signal based on the order of arrival of the first and second edges of the reference and delayed system clock signal in each clock cycle. The second edge detector circuit receives the delayed reference and system clock signals and generates a second signal based on the order of arrival of the first and second edges of the delayed reference and system clock signals in the clock cycle. The logic circuit then receives the first and second signals from the first and second edge detector circuits and outputs a logic signal as a function of the received first and second signals. The compensation circuit then receives the system clock signal and the logic signal and substantially synchronizes the received system clock signal to the reference clock signal by compensating the system clock signal as a function of the received logic signal.

The present invention describes systems, methods, and computer-readable media of varying scope. In addition to the aspects and advantages of the present invention described in this summary, further aspects and advantages of the invention will become apparent by reference to the drawings and by reading the detailed description that follows.

BRIEF DESCRIPTION OF THE DRAWINGS

FIGS. 2, 3, and 4 are timing diagrams illustrating various waveforms and signals received and outputted by flip-flop circuits according to the present invention.

DETAILED DESCRIPTION OF THE INVENTION

The following description is directed towards a digital delay lock loop circuit including a phase detector circuit for substantially synchronizing system clock signal and reference clock signals having a reduced phase offset.

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
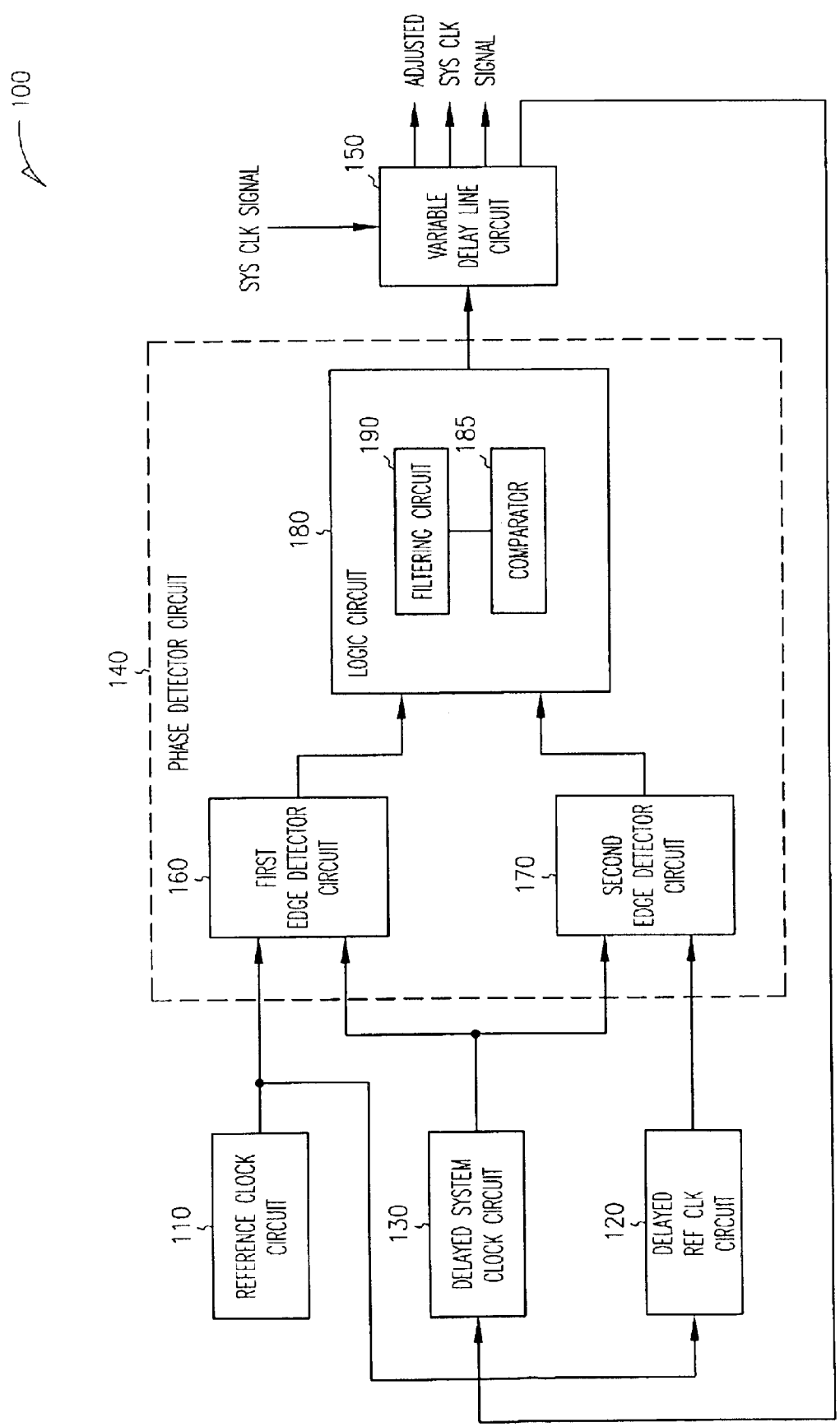
FIG. 1 is a block diagram illustrating one embodiment of a digital delay lock loop circuit including a phase detector circuit according to the present invention.

FIG. 1 shows a representative digital delay lock loop circuit including a phase detector circuit. FIG. 1 includes an example of a digital delay logic (DLL) circuit 100 including a reference clock circuit 110, a delayed reference clock circuit 120, and a delayed system clock circuit 130. FIG. 1 further includes a phase detector circuit 140, coupled to the reference clock circuit 110, delayed reference clock circuit 120, and delayed system clock circuit 130. As shown in FIG. 1, the phase detector circuit includes a logic circuit 180, coupled to the first and second edge detector circuits 160 and 170. The logic circuit 180 further includes a filtering circuit 190 and a comparator 185 coupled to the first and second edge detector circuits 160 and 170. Furthermore, FIG. 1 includes a variable delay line circuit 150, coupled to the logic circuit 180. The terms 'variable delay line circuit' 150 and 'compensation circuit' are interchangeably used throughout this document. In some embodiments, first and second edge detector circuits 160 and 170 can be based on edge triggered flip flop circuits. Also in other embodiments, first and second edge detector circuits 160 and 170 can be based on NAND gate circuitry.

In operation, reference clock circuit 110 generates a reference clock signal of a pulse type waveform. In some embodiments, the reference clock circuit 110 generates the reference clock signal of a pulse type waveform that includes first and second edges in each clock cycle. In these embodiments, the first and second edges are raising and falling edges in each clock cycle having high and low signals, respectively. The high and low signals are less than one half the clock cycle. Also in these embodiments, the clock signals are logic signals that switch from low to high and then from high to low with a fixed repetition pattern in time.

Delayed reference clock circuit 120 then receives the generated reference clock signal and generates a delayed reference clock signal. In some embodiments, the delayed reference clock circuit 120 generates a delayed reference clock signal of a pulse type waveform described above with reference to the reference clock signal. In these embodiments, the delayed reference clock signal has a first minimum time delay with respect to the reference clock signal. Again in these embodiments, the first minimum time delay is generated using two NAND gates connected back-to-back. This is the resolution of the DLL circuit 100. Typically, in a digital DLL circuit the two signals can only be synchronized within one delay element. A typical delay element is a time delay generated by two NAND gates connected back-to-back, where one input of the NAND gate is used to delay the input signal and the second input of the NAND gate is used to control the input signal.

Delayed system clock circuit 130 generates a delayed system clock signal using a system clock signal. In some embodiments, delayed system clock circuit 130 generates a delayed system clock signal of the pulse type waveform using the system clock signal. In some embodiments, the system clock signal is generated using a system clock circuit. In these embodiments, the delayed system clock signal has a second minimum time delay with respect to the system clock signal. Also, in these embodiments, the first minimum time delay is slightly greater than or equal to a smallest time delay that can be generated using the compensation circuit.

First edge detector circuit 160 receives the generated reference and delayed system clock signals from the reference clock circuit 110 and the delayed system clock circuit 130, respectively. First edge detector circuit 160 then outputs a first signal as a function of order of arrival of the received first and second edges of the reference and delayed system clock signals in each clock cycle. In some embodiments, first edge detector circuit 160, then outputs a high or low signal based on the arrival of the received first and second edges of the reference and delayed system clock signals in each clock cycle.

Second edge detector circuit 170 receives the generated delayed reference and system clock signals from the delayed reference clock circuit 120 and the delayed system clock circuit 130, respectively. Second edge detector circuit 170, then outputs a second signal as a function of order of arrival of the received first and second edges of the delayed reference and system clock signals in each clock cycle. In some embodiments, second edge detector circuit 170, then outputs a high or low signal based on the arrival of the received first and second edges of the delayed reference and system clock signals in each clock cycle.

Logic circuit 180 receives the outputted first and second signals from the first and second edge detector circuits 160 and 170, respectively. Logic circuit 180 then outputs a logic signal as a function of the received first and second signals. In some embodiments, logic circuit 180 receives the outputted high or low signals from the first and second edge detector circuits. Logic circuit 180 then outputs a logic signal based on the received high or low signals from the first and second edge detector circuits 160 and 170.

FIG. 2 shows an example of waveforms and signals received and outputted, respectively by the first and second edge detector circuits 160 and 170. In some embodiments, first and second edge detector circuits 160 and 170 can be first and second edge triggered flip flop circuits. As shown in FIG. 2, first edge detector circuit 160 outputs a low signal, i.e. '0', when the first edge detector circuit 160 detects the arrival of first raising edge 212 of the reference clock signal 210 after the arrival of first raising edge 222 of delayed system clock signal 220. Further, FIG. 2 shows second edge detector circuit 170 outputting a low signal, when the second edge detector circuit 170 detects the arrival of first raising edge 232 of the delayed reference clock signal 230 after the arrival of the first raising edge 222 of delayed system clock signal 220. Logic circuit 180 then outputs a shift-left logic signal upon receiving a low signal from both the first and second edge detector circuits 160 and 170. Variable delay line circuit 150 then adds enough time to delay the system clock signal to substantially synchronize the system clock signal with the reference clock signal upon receiving the shift-left logic signal from the logic circuit 180.

FIG. 3 shows another example of waveforms and signals received and outputted, respectively by the first and second edge detector circuits 160 and 170. As shown in FIG. 3, first edge detector circuit 160 outputs a high signal, i.e. '1', when the first edge detector circuit 160 detects the arrival of first raising edge 312 of the reference clock signal 210 before the arrival of first raising edge 322 of delayed system clock signal 220. Further, FIG. 3 shows second edge detector circuit 170 outputting a high signal, when the second edge detector circuit 170 detects the arrival of first raising edge 332 of the delayed reference clock signal 230 before the arrival of the first raising edge 322 of delayed system clock signal 220. Logic circuit 180 then outputs a shift-right logic signal upon receiving a high signal from both the first and second edge detector circuits 160 and 170. Variable delay line circuit 150 subtracts enough time to delay the system clock signal to substantially synchronize the system clock signal with the reference clock signal upon receiving the shift-right logic signal from the logic circuit 180.

FIG. 4 shows yet another example of waveforms and signals received and outputted, respectively by the first and second edge detector circuits 160 and 170. As shown in FIG. 4, first edge detector circuit 160 outputs a high signal, when the first edge detector circuit 160 detects the arrival of first raising edge 412 of the reference clock signal 210 before the arrival of first raising edge 422 of delayed system clock signal 220. Further, FIG. 4 shows second edge detector circuit 170 outputting a low signal, when the second edge detector circuit 170 detects the arrival of first raising edge 432 of the delayed reference clock signal 230 after the arrival of the first raising edge 422 of delayed system clock signal 220. Logic circuit 180 outputs a no-shift logic signal upon receiving high and low signals or low and high signals from both the first and second edge detector circuits 160 and 170, respectively. Variable delay line circuit 150 does not make any compensation to the system clock signal to substantially synchronize the system clock signal with the reference clock signal upon receiving the no-shift logic signal from logic circuit 180. The first and second edges described earlier with reference to FIGS. 2, 3, and 4 are raising and falling edges within one half of each clock cycle. It can be seen that by using the compensation schemes described above with reference to FIGS. 2, 3, and 4 the compensated or the actual system clock signal is generally in line with the reference clock signal and stays within plus or minus half a second minimum time delay, i.e. the raising edge of the actual system clock signal is centered around the raising edge of the reference clock signal within plus or minus half a second minimum time delay having a normal distribution.

Variable delay line circuit 150 then receives the system clock signal and the logic signal and substantially synchronizes the received system clock signal to the reference clock signal by compensating the system clock signal based on the received logic signal from logic circuit 180. In some embodiments, variable delay line circuit 150 adds or subtracts enough time to the system clock signal to substantially synchronize the system clock signal with the reference clock signal based on the received logic signal from logic signal circuit 180.

In some embodiments, logic circuit 180 includes filtering circuit 190 and comparator 185. In these embodiments, filtering circuit 190 receives the outputted high/low signals from the first and second edge detector circuits 160 and 170 and determines the number of consecutive high/low signals received from the first and second edge detector circuits 160 and 170. In some embodiments, the filtering circuit 190 determines number of substantially consecutive high/low signals received from the first and second edge detector circuits 160 and 170. In some embodiments, the filtering circuit 190 determines the number of consecutive high/low signals received from the first and second edge detector circuits 160 and 170. In some embodiments, the predetermined number of consecutive or substantially consecutive high/low signals is approximately in the range of about 8 to 32.

Comparator 185 then compares the determined number of consecutive high or low signals to a predetermined number of consecutive or substantially consecutive high or low signals. In these embodiments, variable delay line circuit 150 dynamically adds enough time to or subtracts enough time from the system clock every clock signal every predetermined number of substantially consecutive high or low signals until the system clock signal substantially synchronizes with the reference clock signal. Comparator 185, then outputs a shift-left logic/shift-right logic signal based on the outcome of the comparison.

As shown in FIG. 1, the substantially synchronized system clock signal (adjusted system clock signal) is multiplexed and outputted from the variable delay line circuit 150. One of the multiplexed adjusted system clock signal is then fed back into the delayed system clock signal circuit to continuously repeat the above described process to substantially synchronize the system clock signal with the reference clock signal on a real time basis.

Figure 5:
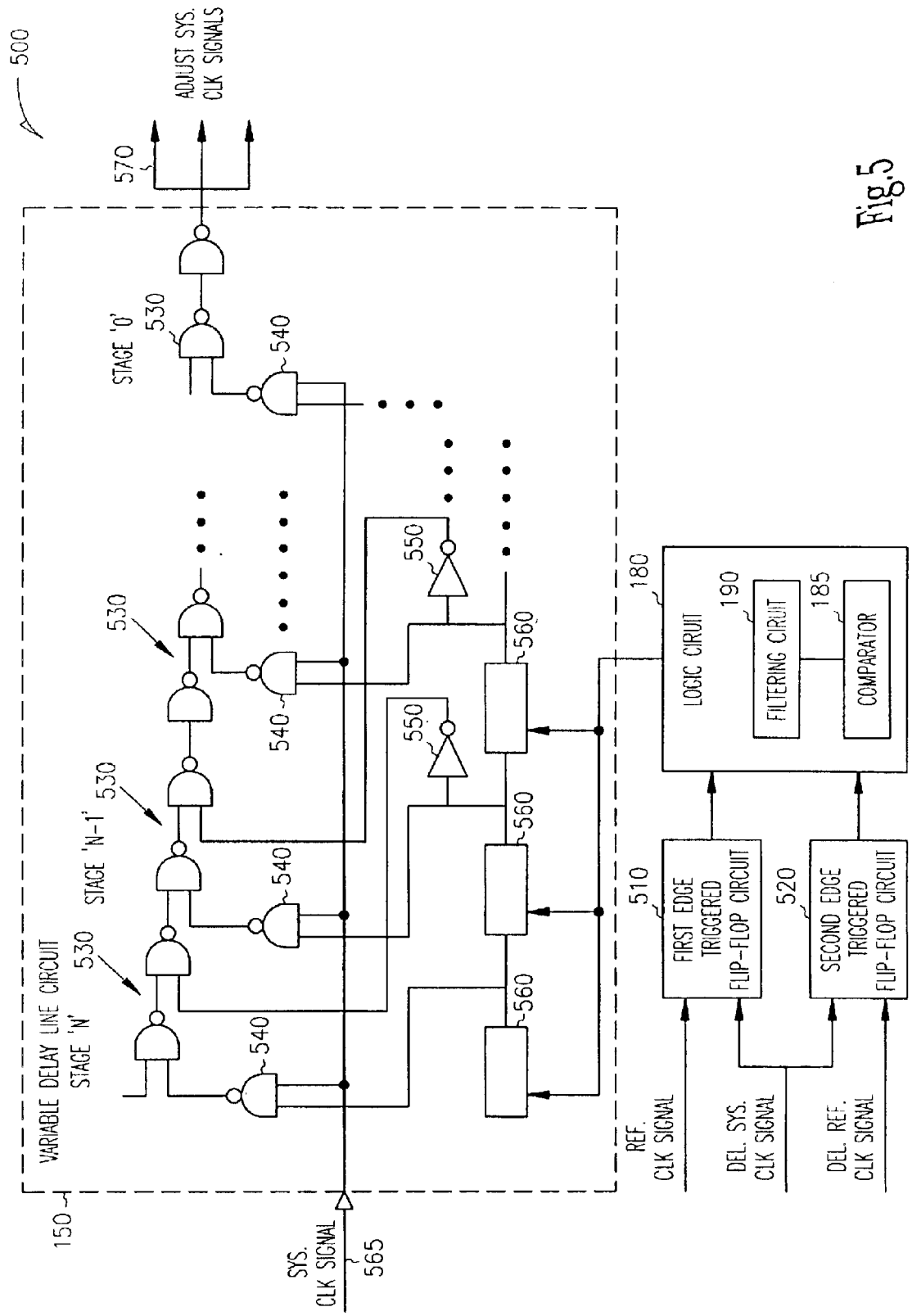
FIG. 5 is a schematic diagram illustrating one embodiment of the digital delay lock loop circuit shown in FIG. 1.

FIG. 5 is a schematic diagram 500 illustrating generally by way of example but not by way of limitation one embodiment of a digital delay lock loop circuit according to the present invention. In this embodiment, the digital delay lock loop circuit includes first and second edge triggered flip flop circuits 510 and 520 coupled to a logic circuit 180. A variable delay line circuit 150 is coupled to logic circuit 180. The logic circuit 180 further includes a filtering circuit 190 and a comparator 185. In the embodiment shown in FIG. 5, filtering circuit 190 is coupled to comparator 185. As shown in FIG. 5, variable delay line circuit 150 is coupled to receive system clock signal 565 and outputs adjusted multiplexed system clock signals 570.

As shown in FIG. 5, variable delay line circuit 150 further includes a plurality of shift registers 560, a plurality of inverters 550, a plurality of NAND gates 540, and a plurality of back-to-back NAND gates 530. A first input of each shift register is coupled to receive the logic signal from logic circuit 180. A second input of each shift register is coupled to receive an output of preceding shift register. An input of each inverter is coupled to an output of associated shift register. A first input of each NAND gate is coupled to an associated output of the shift register and the input of each associated inverter. A second input of the NAND gate is coupled to receive system clock signal 565.

Each of the back-to-back NAND gates 530 have first and second NAND gates. A first input of the first NAND gate is coupled to an output of associated NAND gate. A first input of second NAND gate is coupled to the output of the associated inverter. A second input of the second NAND gate is coupled to the output of the first NAND gate. An output of the second NAND gate is coupled to adjacent back-to-back NAND gates 530 and a multiplexed output 570 to provide adjusted multiple system clock signals as a function of the received logic signal from the logic circuit 180. In operation, plurality of shift registers 560 receive the shift-left/shift-right logic signal from the comparator 185, and adjusts system clock signal using back-to-back NAND gates 530 as a function of the received shift-left/shift-right logic signal. Adjusted system clock signal is then multiplexed and outputted through the multiplexed output 570.

Figure 6:
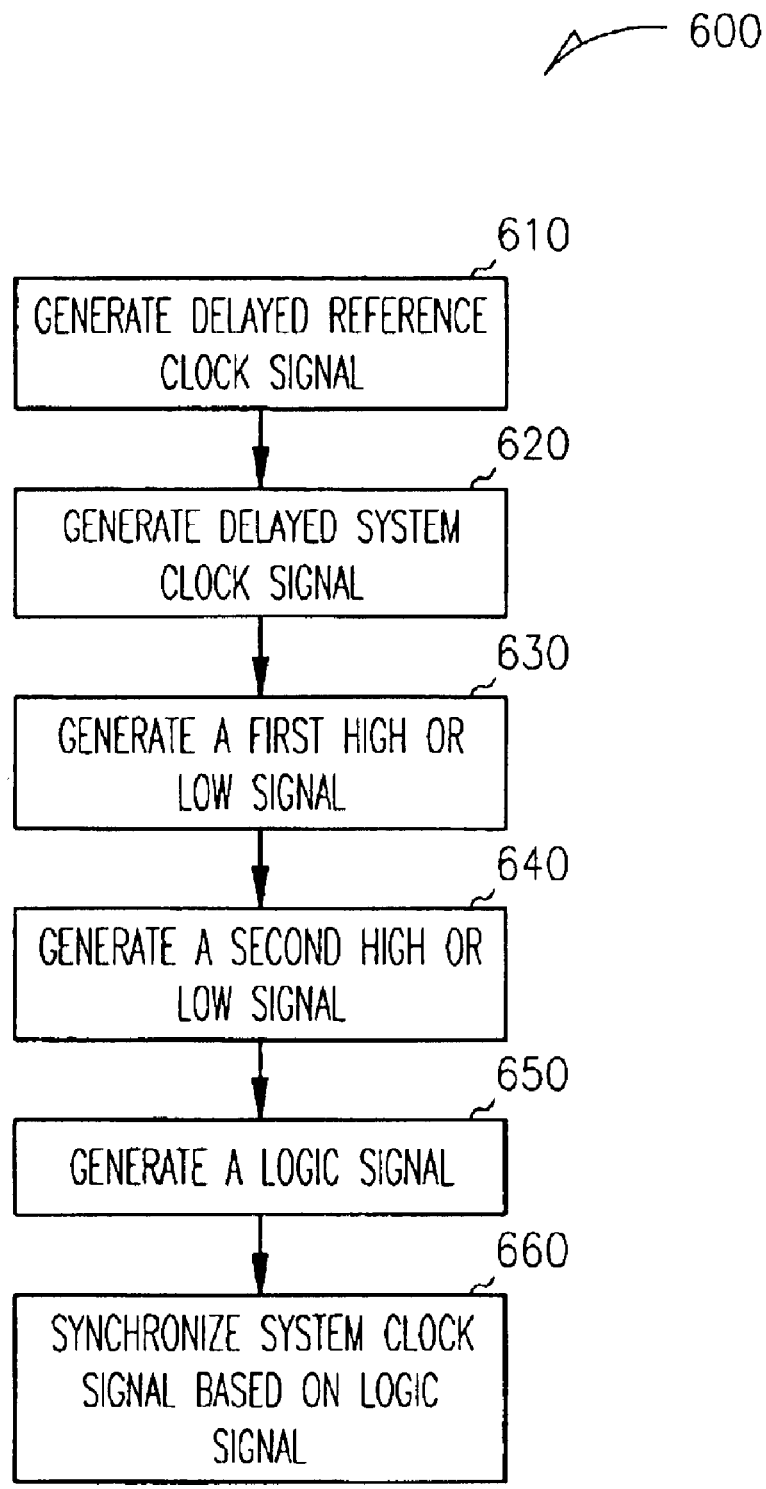
FIG. 6 is a flowchart of one embodiment of a method of synchronizing the system clock signal to the reference clock signal according to the present invention.

FIG. 6 is a flowchart 600 of one exemplary method of synchronizing a system clock signal to a reference clock signal, according to the present invention. Flowchart 600 includes operations 610–660, which are arranged serially in the exemplary embodiment. However, other embodiments of the subject matter may execute two or more operations in parallel, using multiple processors or a single processor organized as two or more virtual machines or sub-processors. Moreover, still other embodiments implement the operations as two or more specific interconnected hardware modules with related control and data signals communicated between and through the modules, or as portions of an application-specific integrated circuit. Thus, the exemplary process flow is applicable to software, firmware, and hardware implementations.

As shown in FIG. 6, operation 610 generates a delayed reference clock signal of a pulse type waveform using a reference clock signal. In some embodiments, the system generates the delayed reference clock signal having a first minimum time delay with respect to the reference clock signal. The first minimum time delay is slightly greater than or equal to a smallest time delay that can be generated by the system. In these embodiments, the first minimum time delay is generated using two NAND gates connected back-to-back.

The pulse type waveform is a logic signal having first and second edges in each clock cycle. The pulse type waveform switches from low to high and high to low with a fixed repetition pattern in time. First and second edges are raising and falling edges of high and low signals of a single clock cycle. The pulse type waveform can be waveforms, such as a square pulse type waveform. The pulse type waveform can also be any waveform that has a positive edge and a negative edge in each clock cycle. In some embodiments, operation 610 can include generating system and reference clock signals.

Operation 620 generates a delayed system clock signal of the pulse type waveform using a system clock signal. In some embodiments, the delayed system clock signal is generated having a second minimum time delay. The second minimum time delay is about half the first minimum time delay. In these embodiments, the pulse type waveform is a logic signal having first and second edges in each clock cycle. The pulse type waveform switches from low to high and high to low with a fixed repetition pattern in time. First and second edges are raising and falling edges of high and low signals of a single clock cycle. The pulse type waveform can be waveforms, such as a square pulse type waveform.

Operation 630 includes inputting the generated delayed system clock signal and the reference clock signal and generating a high or low signal based on the arrival of the first and second edges of the reference clock signal with respect to the arrival of the first and second edges of the delayed system clock signal in each clock cycle.

Operation 640 includes inputting the generated delayed system and delayed reference clock signals and generating a first high or low signal based on determining the arrival of the first and second edges of the delayed reference clock signal with respect to the arrival of the first and second edges of the delayed system clock signal in the clock cycle.

The system generates first and second high signals when the arrival of the first edge of the delayed system clock signal is detected before detecting the arrival of the first edges of the reference and delayed reference clock signals in each clock cycle. The system further generates first and second low signals when the arrival of the first edge of the delayed system clock signal is detected after detecting the arrival of the first edges of the reference and delayed reference clock signals in the clock cycle. Also, the system generates a first high or low signal and a second low or high signal when the arrival of the first edge of the delayed system clock signal is detected after or before the arrival of the first edge of the reference clock signal and before or after detecting the first edge of the delayed reference clock signal, respectively, in the clock cycle.

Operation 650 generates a logic signal based on the generated first and second high or low signals. The system generates a shift-left logic signal upon receiving the generated first and second high signals. The system further generates a shift-right logic signal upon receiving the generated first and second low signals. The system also generates a no-shift logic signal upon receiving the generated first high and second low or the first low and second high signals. In some embodiments, operation 650 includes determining a number of substantially consecutive high signals. Operation 650 then includes comparing the determined number of substantially consecutive high or low signals to a predetermined number of substantially consecutive high or low signals. In these embodiments, operation 650 further includes outputting the logic signal based on the outcome of the comparison and compensating the system clock signal based on the outputted logic signal. In some embodiments, the predetermined number of substantially consecutive high or low signals is approximately in the range of about 8 to 32.

Operation 650 includes outputting a shift-left logic signal, when the determined received number of substantially consecutive high signals is higher than the predetermined number of substantially consecutive high or low signals. Further, operation 650 includes outputting a shift-right logic signal, when the determined number of substantially consecutive low signals is higher than the predetermined number of substantially consecutive high or low signals.

Operation 660 includes synchronizing the system clock signal by compensating the system clock signal based on the generated logic signal. The system compensates the system clock signal with the reference clock signal by adding enough time to delay the system clock signal to substantially synchronize the system clock signal with the reference clock signal upon receiving the generated shift-left logic signal. The system clock signal then compensates the system clock signal with the reference clock signal by subtracting enough time to speed up the system clock signal to substantially synchronize the system clock signal with the reference clock signal upon receiving the generated shift-right logic signal. The system does not compensate the system clock signal upon receiving the generated no-shift logic signal. The system compensates the system clock signal to substantially synchronize the system clock signal with respect to the reference clock signal by adding or subtracting enough synchronizing time generated by using one or more NAND gates connected back-to-back based on the generated logic signal.

Conclusion

Systems, methods, and apparatus for generating substantially synchronized signals with a reduced phase offset to improve operating speeds of integrated circuits have been described. Although specific embodiments have been illustrated and described herein, it will be appreciated by those skill in the art that any arrangement, which is calculated to achieve the same purpose may be substituted for the specific embodiments shown. This application is intended to cover any adaptations or variations of the present invention. For example, although described in procedural terms, one of ordinary skill in the art will appreciate that the invention can be implemented in an object-oriented design environment or any other design environment that provides the required relationships.

In particular, one of skill in the art will readily appreciate that the names of the methods and apparatus are not intended to limit embodiments of the invention. Furthermore, additional methods and apparatus can be added to the components to correspond to future enhancements and physical devices used in embodiments of the invention can be introduced without departing from the scope of embodiments of the invention. One of skill in the art will readily recognize that embodiments of the invention are applicable to future digital DLL circuits used in synchronizing the system and reference clocks.

What is claimed is:

1. A digital delay lock loop circuit comprising:
 a delayed reference clock circuit to receive a reference clock signal and to generate a delayed reference clock signal having a first minimum time delay with respect to the reference clock signal, wherein the delayed reference clock signal has first and second edges in each clock cycle;
 a delayed system clock circuit to receive a system clock signal and to generate a delayed system clock signal having a second minimum time delay with reference to the reference clock signal, wherein the second minimum time delay is about half the first minimum time delay, wherein the delayed system clock signal has first and second edges in each clock cycle;
 a phase detector circuit, comprising:
  a first edge detector circuit having first and second inputs to receive the reference and delayed system clock signals, respectively, and to output a first signal based on order of arrival of the received first and second edges of the reference and delayed system clock signals in each clock cycle;
  a second edge detector circuit having first and second inputs to receive the delayed reference and delayed system clock signals, respectively, and to output a second signal based on order of arrival of the received first and second edges of the delayed reference and delayed system clock signals in each clock cycle;

a logic circuit to receive the first and second signals from the first and second edge detector circuits, respectively, and to output a logic signal based on the received signals; and a compensation circuit to receive the system clock signal and the logic signal and to substantially synchronize the received system clock signal to the reference clock signal by compensating the system clock signal as a function of the received logic signal.

2. The circuit of claim 1, wherein the first edge detector circuit outputs a low signal, when the delayed system clock signal arrives before the reference clock signal in each clock cycle, wherein the second edge detector circuit outputs a low signal, when the delayed system clock signal arrives before the delayed reference clock signal in each clock cycle, and wherein the logic circuit outputs a shift-left logic signal as a function of receiving the low signals from the first and second edge detector circuits, wherein the compensation circuit adds enough time to delay the system clock signal to substantially synchronize the system clock signal with the reference clock signal in each clock cycle.

3. The circuit of claim 2, wherein the first edge detector circuit outputs a high signal, when the delayed system clock signal arrives after the first reference clock signal in each clock cycle, wherein the second edge detector circuit outputs a high signal, when the delayed clock signal arrives after the delayed reference clock signal in each clock cycle, wherein the second edge detector circuit outputs a high signal, when the delayed system clock signal arrives after the delayed reference clock signal in each clock cycle, and wherein the logic circuit outputs a shift-right logic signal as a function of receiving the high signals from the first and second edge detector circuits, wherein the compensation circuit subtracts enough time to speed up the system clock signal to substantially synchronize the system clock signal with the reference clock signal.

4. The circuit of claim 3, wherein the first and second edge detector circuits output high and low signals, when the delayed system clock signal arrives before and after the reference and delayed reference clock signals in each clock cycle, respectively, and wherein the logic circuit outputs a no-shift logic signal as a function of receiving the high and low signals from the first and second edge detector circuits, wherein the compensation circuit does not compensate the system clock signal to substantially synchronize the system clock signal with the reference clock signal.

5. The circuit of claim 4, wherein the compensation circuit adds enough time to or subtracts enough time from the system clock signal to substantially synchronize with the reference clock signal by using a synchronizing time, wherein the synchronizing time is generated using one or more NAND gates connected back-to-back based on the received logic signal.

6. The circuit of claim 4, wherein the logic circuit further comprises:

a filtering circuit to receive the high and low signals from the first and second edge detector circuits and to determine a number of substantially consecutive high/low signals received from the first and second edge detector circuits; and a comparator to compare the determined number of substantially consecutive high/low signals to a predetermined number of substantially consecutive high/low signals and output the shift-left/shift-right logic signal based on the comparison, wherein the compensation circuit to receive the shift-left/shift-right logic signal from the comparator circuit and substantially synchronize the system clock signal to the reference signal by respectively adding enough time to or subtracting enough time from the system clock signal as a function of the received logic signal from the comparator, wherein the compensation circuit dynamically adds enough time to or subtracts enough time from the system clock each clock signal every predetermined number of substantially consecutive high/low signals until the system clock signal is substantially synchronized with the reference clock signal.

7. The circuit of claim 6, wherein the predetermined number of substantially consecutive high/low signals is approximately in the range of about 8 to 32.

8. The circuit of claim 1, further comprising:

a system clock signal circuit to generate the system clock signal, wherein the system clock signal is of a pulse type waveform having first and second edges; and a reference clock signal circuit to generate a the reference clock signal, wherein the reference clock signal is of a pulse type waveform having first and second edges.

9. The circuit of claim 8, wherein the first and second edges of the pulse waveform comprise raising and falling edges, respectively, in each clock cycle having high and low signals, respectively, wherein the high and low signals are less than one half the clock cycle.

10. The circuit of claim 9, wherein the reference and system clock signals are logic signals of a pulse waveform that switches from low to high and then from high to low with a fixed repetition pattern in time.

11. The circuit of claim 1, wherein the first minimum time delay is slightly greater than or equal to a smallest time delay that can be generated using the compensation circuit.

12. The circuit of claim 1, wherein the first minimum time delay is generated using two NAND gates connected back-to-back.

13. A circuit for synchronizing a system clock signal with a reference clock signal comprising:

a first edge triggered flip flop circuit having first and second inputs to receive the reference clock signal and a delayed system clock signal having first and second edges in each clock cycle, respectively, and to output a first signal based on the order of arrival of the first and second edges of the reference and delayed system clock signals in each clock cycle;

a second edge triggered flip flop circuit having first and second inputs to receive a delayed reference clock signal and the delayed system clock signal having the first and second edges in each clock cycle, respectively, and to output a second signal based on the order of arrival of the first and second edges of the delayed reference and system clock signals in each clock cycle, wherein the delayed reference clock signal is generated by delaying the reference clock signal using a first minimum time delay, and the delayed system clock signal is generated by delaying a system clock signal using a second minimum time delay, wherein the second minimum time delay is about half the first minimum time delay;

a logic circuit to receive the first and second signals from the first and second edge triggered flip flop circuits and to output a logic signal based on the received signals from the first and second edge triggered flip flop circuits; and a variable delay line circuit to receive the system clock signal and the logic signal and add/subtract time as a function of the logic signal to the system clock signal to substantially synchronize the system clock signal to the reference clock signal.

14. The circuit of claim 13, wherein the first edge triggered flip flop circuit outputs a low signal, when the first edge triggered flip flop circuit detects the first edge of the delayed system clock signal before detecting the first edge of the reference clock signal in each clock cycle, wherein the second edge triggered flip flop circuit outputs a low signal, when the second flip-flop circuit detects the first edge of the delayed system clock signal before detecting the first edge of the delayed reference clock signal in each clock cycle, and wherein the logic circuit outputs a shift-left logic signal based on receiving the low signals from the first and second edge triggered flip flop circuits, wherein the compensation circuit adds enough time to delay the system clock signal to substantially synchronize the system clock signal with the reference clock signal.

15. The circuit of claim 14, wherein the first edge triggered flip flop circuit outputs a high signal, when the first edge triggered flip flop circuit detects the first edge of the delayed system clock signal after detecting the first edge of the first reference clock signal in each clock cycle, wherein the second edge triggered flip flop circuit outputs a high signal, when the second edge triggered flip flop circuit detects the first edge of the delayed system clock signal after detecting the first edge of the delayed reference clock signal in each clock cycle, and wherein the logic circuit outputs a shift-right logic signal based on receiving the high signals from the first and second edge triggered flip flop circuits, wherein the compensation circuit subtracts enough time to speed up the system clock signal to substantially synchronize the system clock signal with the reference clock signal.

16. The circuit of claim 15, wherein the first and second edge triggered flip flop circuits output high and low signals, when the first and second edge triggered flip flop circuits detect the first edge of the delayed system clock signal before and after detecting the first edges of the reference and delayed reference clock signals in each clock cycle, respectively, and wherein the logic circuit outputs a no-shift logic signal based on receiving the high and low signals from the first and second edge triggered flip flop circuits, wherein the compensation circuit does not compensate the system clock signal to substantially synchronize the system clock signal with the reference clock signal.

17. The circuit of claim 16, wherein the compensation circuit adds enough time to or subtracts enough time from the system clock signal to substantially synchronize with the reference clock signal by using a synchronizing time, wherein the synchronizing time is generated using one or more NAND gates connected back-to-back based on the received logic signal.

18. The circuit of claim 16, wherein the logic circuit further comprises:

a filtering circuit to receive the high and low signals from the first and second edge triggered flip flop circuits and to determine a number of substantially consecutive high/low signals received from the first and second edge triggered flip flop circuits; and a comparator coupled to the filtering circuit to compare the determined number of consecutive high/low signals to a predetermined number of consecutive clock cycles and output a shift-left/shift-right logic signal based on the comparison, wherein the compensation circuit to receive the shift-left/shift-right logic signal from the comparator circuit and substantially synchronize the system clock signal to the reference signal by respectively adding enough time to or subtracting enough time from the system clock signal as a function of received logic signal from the comparator.

19. The circuit of claim 18, wherein the predetermined number of substantially consecutive high/low signals is approximately in the range of about 8 to 32.

20. The circuit of claim 18, wherein the compensation circuit adding/subtracting enough time comprises adding/subtracting less than one clock cycle to substantially synchronize the system clock signal with the reference clock signal.

21. The circuit of claim 13, further comprising:

a system clock signal circuit to generate the system clock signal, wherein the system clock signal is of a pulse type waveform;

a reference clock signal circuit to generate a the reference clock signal, wherein the reference clock signal is of a pulse type waveform;

a delayed reference clock circuit to receive the reference clock signal and to generate the delayed reference clock signal having a first minimum time delay with respect to the reference clock signal; and a delayed system clock circuit to receive the system clock signal and to generate the delayed system clock signal having a second minimum time delay with reference to the reference clock signal, wherein the second minimum time delay is about half the first minimum time delay.

22. The circuit of claim 21, wherein the first and second edges of the pulse waveform comprises raising and falling edges, respectively, in each clock cycle having high and low signals, respectively, wherein the high and low signals are less than one half the clock cycle.

23. The circuit of claim 22, wherein the clock signals are logic signals of a pulse waveform that switches from low to high and then from high to low with a fixed repetition pattern in time.

24. The circuit of claim 13, wherein the first minimum time delay is slightly greater than or equal to a smallest time deal that can be generated using the compensation circuit.

25. The circuit of claim 24, wherein the first minimum time delay is generated using two NAND gates connected back-to-back.

26. A circuit comprising:

a first edge triggered flip flop circuit, coupled to receive a reference clock signal and a delayed system clock signal, wherein the reference and delayed system clock signals have first and second edges in each clock cycle, wherein the first edge triggered flip flop circuit to output a first signal based on order of arrival of the first and second edges of the reference and delayed system clock signals in each clock cycle;

a second edge triggered flip flop circuit, coupled to receive a delayed reference clock signal and the delayed system clock signal, wherein the delayed reference clock signal has first and second edges in each clock cycle, wherein the second edge triggered flip flop circuit to output a second signal based on order of arrival of the first and second edges of the delayed reference and delayed system clock signals in each clock cycle;

a logic circuit, coupled to receive the first and second signals from the first and second edge triggered flip flop circuits, and to provide a logic signal as a function of the received first and second signals;

a variable delay line circuit coupled to the logic circuit to receive the logic signal comprises:

a plurality of shift registers, wherein each shift register has first and second inputs and an output, wherein the first input of each shift register is coupled to receive the logic signal from the logic circuit, wherein the second input of each shift register is coupled to receive an output of preceding shift register;

a plurality of inverters associated with the plurality of shift registers, wherein each inverter has an input and an output, wherein the input of each inverter is coupled to an output of associated shift register;

a plurality of NAND gates associated with the plurality of shift registers and the inverters, wherein each of the NAND gates having first and second inputs and an output, wherein the first input of each NAND gate is coupled to associated output of the shift register and the input of the associated inverter, wherein the second input is coupled to receive system clock signal; and a plurality of back-to-back NAND gates associated with the plurality of NAND gates and plurality of inverters, wherein each of the back-to-back NAND gates has first and second NAND gates, wherein each of the first and second NAND gates have first and second inputs and an output, wherein first input of the first NAND gate is coupled to output of an associated NAND gate, wherein the first input of second NAND gate is coupled to the output of an associated inverter and the second input of the second NAND gate is coupled to the output of the first NAND gate, wherein the output of the second NAND gate is coupled to adjacent back-to-back NAND gates and a multiplexed output to provide adjusted multiple system clock signals as a function of the received logic signal from the logic circuit.

27. The circuit of claim 26, further comprising:

a delayed reference clock circuit, coupled to the reference clock signal and the second edge triggered flip flop circuit, wherein the delayed reference clock circuit to output a delayed reference clock signal, wherein the delayed reference clock signal has a first minimum time delay with respect to the reference clock signal; and a delayed system clock circuit coupled to receive the system clock signal and first edge triggered flip flop circuit, wherein the delayed system clock circuit to output a delayed system clock signal, wherein the delayed system clock signal has a second minimum time delay with reference to the reference clock signal, wherein the second minimum time delay is about half the first minimum time delay.

28. The circuit of claim 26, wherein the logic circuit further comprises:

a filtering circuit to receive the first and second signals from the first and second edge triggered flip flop circuits and to determine a number of substantially consecutive first/second signals received from the first and second edge triggered flip flop circuits; and a comparator coupled to the filtering circuit to compare the determined number of consecutive first/second signals to a predetermined number of consecutive clock cycles and output a shift-left/shift-right logic signal based on the comparison.

29. A method comprising:

generating a delayed reference clock signal using a reference clock signal, wherein the delayed reference clock signal has a first minimum time delay with respect to the reference clock signal, wherein the reference and delayed reference clock signals having first and second edges in each clock cycle;

generating a delayed system clock signal using a system clock signal, wherein the delayed system clock signal is delayed by a second minimum time delay, wherein the second minimum time delay is about half the first minimum time delay, wherein the system and delayed system clock signals having first and second edges in each clock cycle;

inputting the generated delayed system clock signal and the reference clock signal and generating a first signal based on the order of arrival of the first and second edges of the reference clock signal with respect to the first and second edges of the delayed system clock signal in each clock cycle;

inputting the generated delayed system and delayed reference clock signals and generating a second signal based on the order of arrival of the first and second edges of the delayed reference clock signal with respect to the first and second edges of the delayed system clock signal in each clock cycle;

generating a logic signal as a function of the first and second signals; and compensating the system clock signal to substantially synchronize the system clock signal with the reference clock signal as a function of the logic signal.

30. The method of claim 29, wherein compensating the system clock signal to substantially synchronize the clock signal to the reference clock signal comprises:

generating first and second high signals, when the delayed system clock signal arrives before the reference and delayed reference clock signals in each clock cycle;

generating a shift-left logic signal upon receiving the generated first and second high signals; and compensating the system clock signal with the reference clock signal by adding enough time to delay the system clock signal to substantially synchronize the system clock signal with the reference clock signal upon receiving the generated shift-left logic signal.

31. The method of claim 30, wherein compensating the system clock signal to substantially synchronize the system clock signal to the reference clock signal comprises:

generating first and second low signals, when the delayed system clock signal arrives after the reference and delayed reference clock signals in each clock cycle;

generating a shift-right logic signal upon receiving the generated first and second low signals; and compensating the system clock signal with the reference clock signal by subtracting enough time to speed up the system clock signal to substantially synchronize the system clock signal with the reference clock signal upon receiving the generated shift-right logic signal.

32. The method of claim 31, wherein compensating the system clock signal to substantially synchronize the system clock signal to the reference clock signal comprises:

generating a first high signal and a second low signal, when the delayed system clock signal arrives after the reference clock signal and before the delayed reference clock signal in each clock cycle;

generating a first low signal and a second high signal, when the delayed system clock signal arrives before the reference clock signal and after the delayed reference clock signal in each clock signal;

generating a no-shift logic signal upon receiving the generated first high and second low signal/first low and second high signals; and not compensating the system clock signal upon receiving the generated no-shift logic signal.

33. The method of claim 32, wherein compensating the system clock signal by adding enough time to or subtracting enough time from the system clock signal comprises:

compensating the system clock by adding/subtracting a synchronizing time generated by using one or more NAND gates connected back-to-back as a function of the received logic signal.

34. The method of claim 32, wherein compensating the system clock signal by adding enough time to or subtracting enough time from the system clock signal comprises:

determining a number of substantially consecutive high signals/substantially consecutive low signals received;

comparing the determined number of substantially consecutive high/low signals to a predetermined number of substantially consecutive high/low signals;

outputting the logic signal based on the outcome of the comparing; and dynamically compensating the system clock signal by adding enough time to the system clock signal/ subtracting enough time from the system clock signal as a function of the logic signal every predetermined number of substantially consecutive high/low signals until the system clock signal is substantially synchronized with the reference clock signal.

35. The method of claim 34, wherein outputting the logic signal based on the outcome of the comparison comprises:

outputting a shift-left logic signal, when the determined received number of substantially consecutive high signals is higher than the predetermined number of substantially consecutive high/low signals; and outputting a shift-right logic signal, when the determined received number of substantially consecutive low signals is higher than the predetermined number of substantially consecutive high/low signals.

36. The circuit of claim 35, wherein the predetermined number of substantially consecutive high/low signals is approximately in the range of about 8 to 32.

37. The method of claim 29, wherein the reference and system clock signals each comprise a pulse waveform having a positive edge and a negative edge in each clock cycle.

38. The method of claim 29, further comprising:

generating the system clock signal; and generating the reference clock signal.

39. The method of claim 38, wherein the reference and system clock signals are logic signals of a pulse waveform that switches from low to high and then from high to low with a fixed repetition pattern in time.

40. The method of claim 39, wherein the first and second edges of the pulse waveform comprises raising and falling edges in each clock cycle having high and low signals, respectively, wherein the high and low signals are less than one half the clock cycle.

41. A method of synchronizing a system clock signal with a reference clock signal comprising:

generating a delayed reference clock signal of a pulse type waveform using the reference clock signal, wherein the delayed reference clock signal has a first minimum time delay with respect to the reference clock signal, wherein the pulse type waveform has raising and falling edges in each clock cycle;

generating a delayed system clock signal of a pulse type waveform using the system clock signal, wherein the delayed system clock signal is delayed by a second minimum time delay, wherein the second minimum time delay being about half the first minimum time delay, wherein the pulse type waveform has raising and falling edges in each clock cycle;

generating a first signal upon receiving reference clock and delayed system clock signals of a pulse type waveform having raising and falling edges in each clock cycle, and detecting the arrival of the raising edge of the delayed system clock signal before the raising edge of the reference clock signal;

generating a second signal upon receiving reference clock and delayed system clock signals of a pulse type waveform having raising and falling edges in each clock cycle, and detecting the arrival of the raising edge of the delayed system clock signal before the raising edge of the reference clock signal;

generating a logic signal based on receiving the generated first and second signals; and compensating the system clock signal to substantially synchronize the system clock signal with the reference clock signal as a function of the logic signal.

42. The method of claim 41, wherein compensating the system clock signal to substantially synchronize the clock signal to the reference clock signal comprises:

generating first and second high signals when the arrival of the first edge of the delayed system clock signal is detected before detecting the arrival of the first edges of the reference and delayed reference clock signals in each clock cycle;

generating a shift-left logic signal upon receiving the generated first and second high signals; and compensating the system clock signal with the reference clock signal by adding enough time to delay the system clock signal to substantially synchronize the system clock signal with the reference clock signal upon receiving the shift-left logic signal.

43. The method of claim 41, wherein compensating the system clock signal to substantially synchronize the system clock signal to the reference clock signal comprises:

generating first and second low signals when the arrival of the first edge of the delayed system clock signal is detected after detecting the arrival of the first edges of the reference and delayed reference clock signals in each clock cycle;

generating a shift-right logic signal upon receiving the generated first and second low signals; and compensating the system clock signal with the reference clock signal by subtracting enough time to speed up the system clock signal to substantially synchronize the system clock signal with the reference clock signal upon receiving the shift-right logic signal.

44. The method of claim 41, wherein compensating the system clock signal to substantially synchronize the system clock signal to the reference clock signal comprises:

generating a first high signal and a second low signal when the arrival of the first edge of the delayed system clock signal is detected after detecting the arrival of the first edge of the reference clock signal and before detecting the first edge of the delayed reference clock signal in each clock cycle;

generating a first low signal and a second high signal when the arrival of the first edge of the delayed system clock signal is detected before detecting the arrival of the first edge of the reference clock signal and after detecting the arrival of the first edge of the delayed reference clock signal in the clock signal;

generating a no-shift logic signal upon receiving the generated first high and second low signal or the first low and second high signals; and not compensating the system clock signal upon receiving the no-shift logic signal.

45. The method of claim 41, wherein compensating the system clock signal comprises adjusting a variable delay line circuit as a function of the logic signal.

46. The method of claim 45, wherein generating a logic signal comprises:

determining a first number as a function of consecutive first signals received;

determining a second number as a function of consecutive second signals received;

comparing the first number to a first threshold;

comparing the second number to a second threshold; and outputting the logic signal as a function of the comparison of the first number to the first threshold and the second number to the second threshold.

47. The method of claim 46, wherein outputting the logic signal based on the outcome of the comparison comprises:

outputting a shift-left logic signal, when the determined number of substantially consecutive high signals is higher than the predetermined number of substantially consecutive high or low signals; and outputting a shift-right logic signal, when the determined number of substantially consecutive low signals is higher than the predetermined number of substantially consecutive high or low signals.

48. The method of claim 46, wherein compensating the system clock signal by adding or subtracting enough time based on the outcome of the comparison further comprises:

adding or subtracting a synchronizing time generated in increments using one or more NAND gates connected back-to-back to the system clock signal to substantially synchronize the system clock signal with the reference clock signal based on the outcome of the comparing.

49. The circuit of claim 46, wherein the predetermined number of substantially consecutive high or low signals is approximately in the range of about 8 to 32.

* * * * *

UNITED STATES PATENT AND TRADEMARK OFFICE
CERTIFICATE OF CORRECTION

PATENT NO. : 6,836,153 B2
DATED : December 28, 2004
INVENTOR(S) : Birrittellia

It is certified that error appears in the above-identified patent and that said Letters Patent is hereby corrected as shown below:

Column 12,
Line 32, after "generate" delete "a".

Column 14,
Line 38, after "generate" delete "a".

Signed and Sealed this

Nineteenth Day of April, 2005

JON W. DUDAS
*Director of the United States Patent and Trademark Office*